(12) United States Patent
Issani et al.

(10) Patent No.: US 10,992,176 B2
(45) Date of Patent: Apr. 27, 2021

(54) DYNAMIC POWER HARVESTING SYSTEM

(71) Applicants: Siraj Issani, Bangalore (IN); Anand Venkatramani, Nuremberg (DE)

(72) Inventors: Siraj Issani, Bangalore (IN); Anand Venkatramani, Nuremberg (DE)

(73) Assignee: Siemens Aktiengesellschaft, Munich (DE)

( * ) Notice: Subject to any disclaimer, the term of this patent is extended or adjusted under 35 U.S.C. 154(b) by 42 days.

(21) Appl. No.: 16/382,675

(22) Filed: Apr. 12, 2019

(65) Prior Publication Data

US 2019/0326783 A1 Oct. 24, 2019

(30) Foreign Application Priority Data

Apr. 19, 2018 (EP) .................... 18168232

(51) Int. Cl.
*H02J 5/00* (2016.01)
*G01R 31/08* (2020.01)
*H02J 50/12* (2016.01)
*H02J 50/10* (2016.01)
*H02J 50/00* (2016.01)

(52) U.S. Cl.
CPC .......... *H02J 50/001* (2020.01); *G01R 31/085* (2013.01); *H02J 50/10* (2016.02); *H02J 50/12* (2016.02)

(58) Field of Classification Search
CPC ...... H02J 5/00; H02J 50/12; H02J 5/10; H02J 5/001; H02J 50/10; H02J 50/001; G01R 31/085
See application file for complete search history.

(56) References Cited

U.S. PATENT DOCUMENTS

| 10,514,414 | B2* | 12/2019 | Kussyk | .............. H02H 7/261 |
| 2008/0143192 | A1* | 6/2008 | Sample | ............. H02J 50/001 |
| | | | | 307/149 |
| 2009/0058361 | A1* | 3/2009 | John | ..................... H02J 50/80 |
| | | | | 320/128 |

(Continued)

FOREIGN PATENT DOCUMENTS

EP  2947466 A1  11/2015

OTHER PUBLICATIONS

European Search Report for European Patent Application No. 18168232.9-1202 dated Sep. 17, 2018.

(Continued)

*Primary Examiner* — Christopher E Mahoney
(74) *Attorney, Agent, or Firm* — Lempia Summerfield Katz LLC

(57) ABSTRACT

A power harvesting system is provided for harvesting power from a current carrying conductor for powering a load. The power harvesting system includes an energy conversion module at least partially disposable on the current carrying conductor, and an impedance regulation module coupled to the energy conversion module. The energy conversion module couples an induced voltage proportional to a line current flowing in the current carrying conductor, for powering the load. The impedance regulation module dynamically regulates impedance in the power harvesting system for controlling transfer of the power harvested using the induced voltage and the line current, to the load.

17 Claims, 3 Drawing Sheets

(56) References Cited

U.S. PATENT DOCUMENTS

| | | | |
|---|---|---|---|
| 2011/0006742 A1* | 1/2011 | Teggatz | H02J 7/35 |
| | | | 323/234 |
| 2014/0070935 A1* | 3/2014 | Wang | B60C 23/0494 |
| | | | 340/443 |
| 2016/0049800 A1 | 2/2016 | Tanaka | |
| 2017/0179732 A1 | 6/2017 | Hoeppner | |
| 2018/0366981 A1* | 12/2018 | Liao | H02M 7/53846 |
| 2020/0007054 A1* | 1/2020 | Wolfe | H02P 7/29 |

OTHER PUBLICATIONS

Li, Ping, et al. "A high-efficiency management circuit using multiwinding upconversion current transformer for power-line energy harvesting." IEEE Transactions on Industrial Electronics 62.10 (2015): 6327-6335.

* cited by examiner

DYNAMIC POWER HARVESTING SYSTEM

The present patent document claims the benefit of European Patent Application No. EP 18168232.9, filed Apr. 19, 2018, which is also hereby incorporated by reference.

TECHNICAL FIELD

The present disclosure relates to a power harvesting system. More particularly, the present disclosure relates to a system powered by a high impedance unregulated power supply having an increased range of operation.

BACKGROUND

A power supply providing electrical energy to a device may produce low levels of power and/or low potential values. Weak power supplies having such characteristics may include those employing power harvesting from an external source, such as supplies which generate their electrical energy from an ambient electromagnetic radiation. For example, in electromagnetically coupled power harvesting systems mounted on transmission lines, flux generated due to line current flowing therein couples with coils on a magnetic core of the power harvesting system, thereby, linking an induced voltage proportional to the magnitude of the line current. The induced voltage is then power conditioned to provide power to electric loads. If the external source varies, then the supply voltage generated, and/or the power delivered, may also change. An equivalent circuit of a current transformer may include a core resistance in series with a coil inductance and/or a coil capacitance, both powered by the voltage induced due to the line current. When the induced voltage is at its lowest, the power available at the source of the equivalent circuit is also low and therefore the power transferred to the load, that is, the output power decreases. Such changes at the output may affect the operation of the device being driven by the power supply. Moreover, such changes may further affect operation of other devices connected downstream of the device powered by such a power harvesting system.

Conventional power harvesting systems, for example, the power harvesting system disclosed in European Patent No. EP 2947466, addresses the issue of low power output, by employing an impedance matching circuitry inserting, for example, magnetically coupled inductors that match a source impedance of the power harvesting system to its load impedance, thereby providing maximum power transfer from source to load. However, when the induced voltage is high then due to additional impedance in the circuitry, the power output may shoot outside a preferred range of output.

SUMMARY AND DESCRIPTION

The scope of the present disclosure is defined solely by the appended claims and is not affected to any degree by the statements within this summary. The present embodiments may obviate one or more of the drawbacks or limitations in the related art.

It is an object of the present disclosure to provide a power harvesting system of the aforementioned kind that transfers maximum power to the load with minimal power losses at a lower operating range, (e.g., when the induced voltage is low) and limits power being transferred at a higher operating range, (e.g., when the induced voltage is high).

The object is achieved by providing a power harvesting system having an impedance regulation module that dynamically regulates impedance in the power harvesting system for controlling power transferred to the load.

The power harvesting system disclosed herein harvests power from a current carrying conductor. In an embodiment, the current carrying conductor refers to a power line such as an overhead line or an underground cable of a power transmission network and/or a power distribution network. The power harvesting system includes an energy conversion module at least partially disposable on the current carrying conductor. The energy conversion module includes a flux concentrator and a coil. The flux concentrator converts electrical energy being harvested from a line current flowing in the current carrying conductor into magnetic energy in form of an electromagnetically induced flux. The coil wound on the flux concentrator converts the magnetic energy into an electrical equivalent in form of an induced voltage. In an embodiment, the coil is configured as an induction coil including a wire wound around the flux concentrator. In an embodiment, the flux concentrator includes a magnetic core. In another embodiment, the flux concentrator includes a non-magnetic core thereby producing an air-core flux concentrator. The coil of the energy conversion module couples an induced voltage proportional to a line current flowing in the current carrying conductor, for powering a load. Sinusoidally time-varying current flows in the current carrying conductor producing time-varying magnetic fields around the conductor. Windings of the coil positioned proximal to the current carrying conductor couple with the time-varying magnetic fields thereby producing an induced voltage therewithin. The flux concentrator with the wound coil includes a reactive component and the coil includes a resistive component. For a time-varying sinusoidal current flowing in the conductor, the energy conversion module offers an impedance, which is source impedance $Z_{source}$ calculated as sum of a reactance $X_{CC}$ offered by an inductive and/or a capacitive component of the wound coil with the flux concentrator and a resistance $R_{Coil}$ of the coil. The power harvesting system harvests power based on the induced voltage and the line current, which are in turn affected by the source impedance $Z_{source}$.

The power harvesting system includes an impedance regulation module coupled to the energy conversion module. The impedance regulation module dynamically regulates the source impedance $Z_{source}$ in the power harvesting system for controlling transfer of the power harvested using the induced voltage and the line current, to the load. The impedance regulation module includes a switching module, a compensating impedance $Z_C$, and a power detection module. The impedance regulation module is connected between the energy conversion module and the load being powered by the power harvesting system. The compensating impedance $Z_C$ of the impedance regulation module is selected based on the coil of the energy conversion module. The compensating impedance $Z_C$ is selected such that, a reactance $X_C$ of the compensating impedance $Z_C$ at least partially nullifies the reactance $X_{CC}$ of the wound coil of the energy conversion module. In an embodiment, the compensating impedance $Z_C$ is in resonance with the source impedance $Z_{source}$. In an embodiment, the compensating impedance $Z_C$ includes a reactance $X_C$ offered by a capacitor included in the impedance regulation module. This reactance $X_C$ equals the reactance $X_{CC}$ thereby creating a resonance effect, nullifying the reactance offered by the energy conversion module, and reducing the source impedance $Z_{source}$ to resistive component $R_{Coil}$ of the coil. This leads to maximum harvested power being transferred to the load.

The power detection module detects the power harvested based on the induced voltage and the line current $I_L$. In an embodiment, the power detection module detects the power in real time. The power detection module at least partially includes the compensating impedance $Z_C$, in communication with the switching module, when the power harvested is less than a predefined power threshold. The switching module is an electronically controlled switch, for example, a relay whose coil is the control element, a solid state relay whose photo-diode is the control element, etc. According to an embodiment, the compensating impedance $Z_C$ includes two or more capacitors connected in series. In this embodiment, the power detection module along with the switching module includes one or more of the series connected capacitors into the power harvesting system. The power detection module excludes the compensating impedance $Z_C$ when the power harvested is greater than a predefined power threshold and/or equal to the predefined power threshold. By excluding the compensating impedance, the power harvesting system provides safety of the load. Thus, the power harvesting system increases a range of harvesting of power from a varying line current while providing that power is limited within a prescribed range of safe operation of the load. The power threshold is defined based on power requirements of the load being driven by the power harvesting system and the input power available from the line current flowing in the current carrying conductor.

Also disclosed herein, is a power distribution network device physically disposable on a current carrying conductor of a power distribution network. The power distribution network device includes a sensor, a processor, an indicator, and the power harvesting system disclosed herein. The power distribution network device is a fault sensing indicator mounted on overhead power lines. The sensor measures one or more parameters associated with the current carrying conductor. The parameters include, for example, a line current and a line voltage. The processor detects a fault in the power distribution network based on the parameters. The fault is, for example, a line-to-line fault, a line-to-earth fault, a short circuit fault, etc., on the power distribution network. The indicator indicates the fault, for example, by flashing a visual indication signal with help of light emitting diodes, etc. In an embodiment, the power distribution network device also includes a communication module transmitting data associated with faults to a communication hub at a substation. The power harvesting system powers the sensor, the processor, the indicator, and the communication module of the power distribution network device.

BRIEF DESCRIPTION OF THE DRAWINGS

The above-mentioned and other features of the disclosure will now be addressed with reference to the accompanying drawings. The illustrated embodiments are intended to illustrate, but not limit the disclosure.

The present disclosure is further described hereinafter with reference to illustrated embodiments shown in the accompanying drawings, in which.

DETAILED DESCRIPTION

Figure 1:
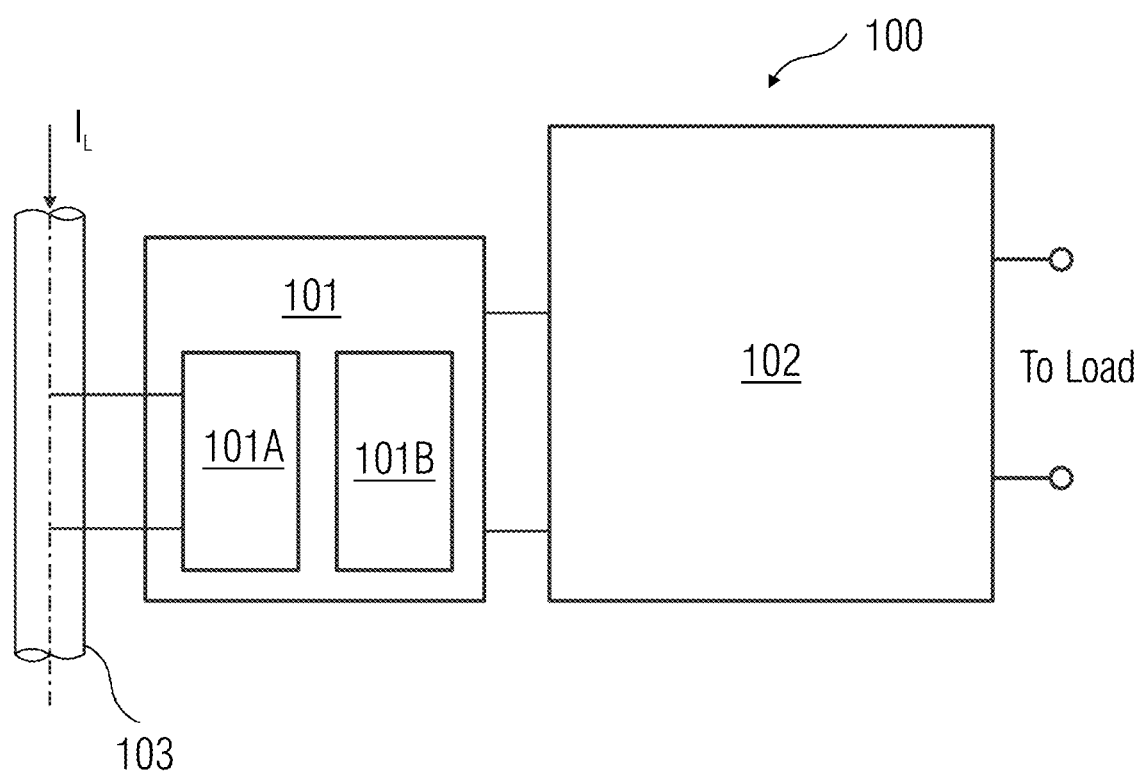
FIG. 1 illustrates a block diagram of an example of a power harvesting system, including a coil and an impedance regulation module, for powering a load attached thereto.

Various embodiments are described with reference to the drawings, wherein like reference numerals are used to refer to like elements throughout. In the following description, for the purpose of explanation, numerous specific details are set forth in order to provide thorough understanding of one or more embodiments. It may be evident that such embodiments may be practiced without these specific details.

FIG. 1 illustrates a block diagram of a power harvesting system 100, including an energy conversion module 101 and an impedance regulation module 102, for powering a load attached thereto. The energy conversion module 101 includes a flux concentrator 101A such as a magnetic/non-magnetic core and a coil 101B wound around the flux concentrator 101A. The energy conversion module 101 is positioned near a bare or an insulated current carrying conductor 103. For example, the flux concentrator 101A is positioned surrounding the current carrying conductor 103 such that the current carrying conductor 103 passes through the flux concentrator 101A, that is, through a gap created within a core of the flux concentrator 101A. A line current $I_L$ flowing through the current carrying conductor 103 produces a magnetic field (not shown) encircling the current carrying conductor 103. The magnetic field gets coupled with the flux concentrator 101A and induces a flux in the flux concentrator 101A. This induced flux when coupled with the coil 101B wound on the flux concentrator 101A, produces an induced voltage $V_{ind}$ across the coil 101. The impedance regulation module 102 controls transfer of power being harvested by the power harvesting system 100 using the induced voltage $V_{ind}$ and the line current $I_L$, to the load connected thereto.

Figure 2:
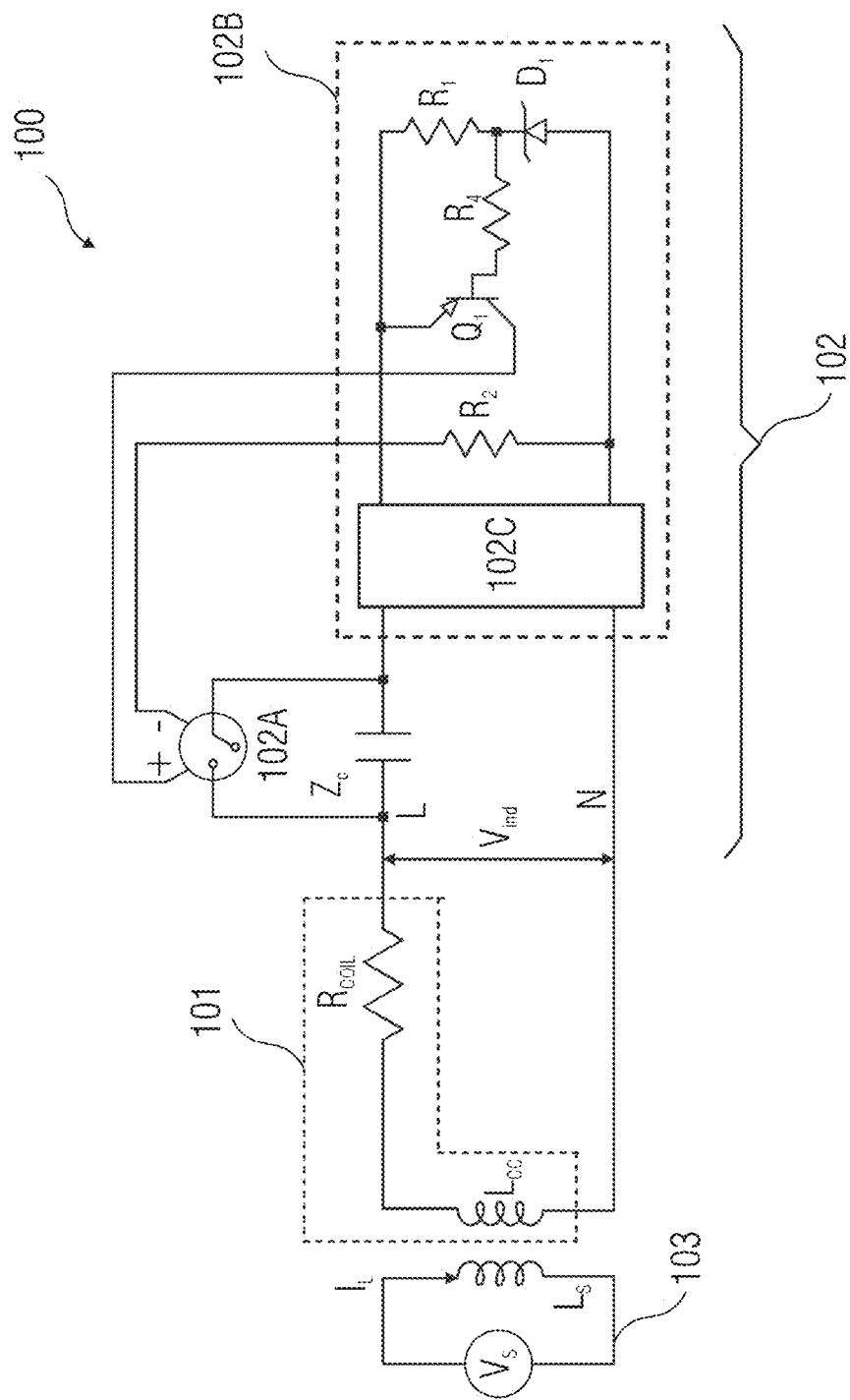
FIG. 2 illustrates an example of an electrical equivalent circuit diagram of power harvesting system shown in FIG. 1.

FIG. 2 illustrates an electrical equivalent circuit diagram of power harvesting system 100 shown in FIG. 1. The current carrying conductor 103 is represented by an electrical equivalent circuit having a source voltage $V_S$ and an inductor $L_S$ through which a line current $I_L$ flows. The energy conversion module 101 of the power harvesting system 100 is represented by its electrical equivalent circuit having a resistive component of the coil 101B represented by resistor $R_{Coil}$ and a reactive component of the wound coil 101B together with the flux concentrator 101A represented by an inductor $L_{CC}$. The impedance regulation module 102 of the power harvesting system 100 includes a switching module 102A, a power detection module 102B, and a compensating impedance $Z_C$.

The power harvesting system 100 operates in two states. First state of operation is when the power harvested based on the induced voltage $V_{ind}$ and the line current $I_L$, is lesser than a predefined power threshold $P_T$ and second state of operation is when the power harvested is greater than or equal to the predefined power threshold $P_T$. In the first state of operation, the power detection module 102B keeps the switching module 102A de-activated. The compensating impedance $Z_C$ remains to be connected in series with the energy conversion module 101. A reactive component $X_C$ of the compensating impedance $Z_C$ is in resonance with the reactive component $X_{CC}$ defined by the wound coil inductance $L_{CC}$, thereby reducing effective source impedance $Z_{source}$ of the power harvesting system 100 to the coil resistance $R_{Coil}$, as given in equation (1) below:

$$Z_{source} = R_{Coil} \quad (1)$$

This provides maximum power transfer to load when the induced voltage $V_{ind}$ is below a predefined power threshold.

In the second state of operation, the power detection module 102B detects that the power harvested based on the induced voltage $V_{ind}$ and the line current $I_L$, has equaled or exceeded the predefined power threshold $P_T$. The power detection module 102B activates the switching module 102A such that the compensating impedance $Z_C$ is bypassed, thereby making the effective source impedance $Z_{source}$ dependent on the coil resistance $R_{Coil}$ and the wound coil inductance $L_{CC}$, as given by equation (2) below:

$$Z_{source} = \sqrt{(R_{Coil}^2 + X_{CC}^2)} \quad (2)$$

Where $X_{CC} = 2\Pi f(L_{CC})$ and f is the frequency of operation, for example, 50 Hz.

The power detection module 102B includes a rectifier 102C, a transistor Q1, and a diode D1. The rectifier 102C converts an AC waveform of the induced voltage $V_{ind}$ into a single ended voltage waveform which is compared with a bypass voltage $V_{byp}$. The bypass voltage $V_{byp}$ is a voltage required for activating the switching module 102A. The bypass voltage $V_{byp}$ is set based on the predefined power threshold $P_T$. For example, if the load being powered by the power harvesting system 100 has an operating power range of up to $P_T$ Watts then the bypass voltage $V_{byp}$ is selected such that the switching module 102A activates as soon as the bypass voltage $V_{byp}$ becomes equal to or greater than $P_T/I_L$, in order to assess whether the power being transferred to the load is within the predefined power threshold $P_T$. The power impedance regulation module 102 at any time instant maintains power harvested less than the predefined power threshold $P_T$, that is, to maintain the induced voltage $V_{ind}$ less than $P_T/I_L$.

In order to set the bypass voltage $V_{byp}$ according to the predefined power threshold $P_T$ the diode D1 and the transistor Q1 are selected such that:

$$V_{byp} = V_{ref} + V_{BE} \quad (3)$$

Where $V_{BE}$ is the cut-off voltage for the transistor Q1 to conduct and $V_{ref}$ is the voltage required for the diode D1 to forward bias. When the induced voltage $V_{ind}$ becomes equal to the base emitter voltage $V_{BE}$, the transistor Q1 conducts. Further as the induced voltage $V_{ind}$ increases to equal sum of the base emitter voltage $V_{BE}$ and the voltage $V_{ref}$, which is equal to the set bypass voltage $V_{byp}$, a control element of the switching module 102A activates, thereby bypassing the compensating impedance $Z_C$ and increasing the effective source impedance $Z_{source}$, given by equation (4) below:

$$Z_{source} = \sqrt{(R_{Coil}^2 + X_{CC}^2)} \quad (4)$$

The increase in source impedance $Z_{source}$ thus, limits the power being transferred to the load.

When the induced voltage $V_{ind}$ starts decreasing and becomes lesser than the bypass voltage $V_{byp}$ the switching module 102A gets de-activated. The induced voltage $V_{ind}$ decreases further to equal the base emitter voltage $V_{BE}$, the diode D1 comes out of its forward bias operation region. The induced voltage $V_{ind}$ decreases further below the base emitter voltage $V_{BE}$, the transistor Q1 stops conducting, thereby bringing the compensating impedance $Z_C$ back in connection with the energy conversion module 101 and decreasing the effective source impedance $Z_{source}$, given by equation (5) below:

$$Z_{source} = R_{Coil} \quad (5)$$

The decrease in source impedance $Z_{source}$ thus, increases the power being transferred to the load.

Thus, the power harvesting system 100, detects power available at the source using current and/or voltage signatures, that is, the line current $I_L$ and the induced voltage $V_{ind}$. Based on this detected power, the power harvesting system 100 dynamically changes source impedance $Z_{source}$ to create resonance effect and increase power transferred to load at lower operating points, whereas decrease power transferred to load at higher operating points. The power harvesting system 100 disclosed herein advantageously achieves an increased range of operation for devices powering electronic loads via a current transformer, reduces overall weight and cost associated with such devices, reduces stress experienced by downstream loads connected to the devices, lowers complexity of device construction by use of discrete components, and increases the device's lifetime.

Figure 3:
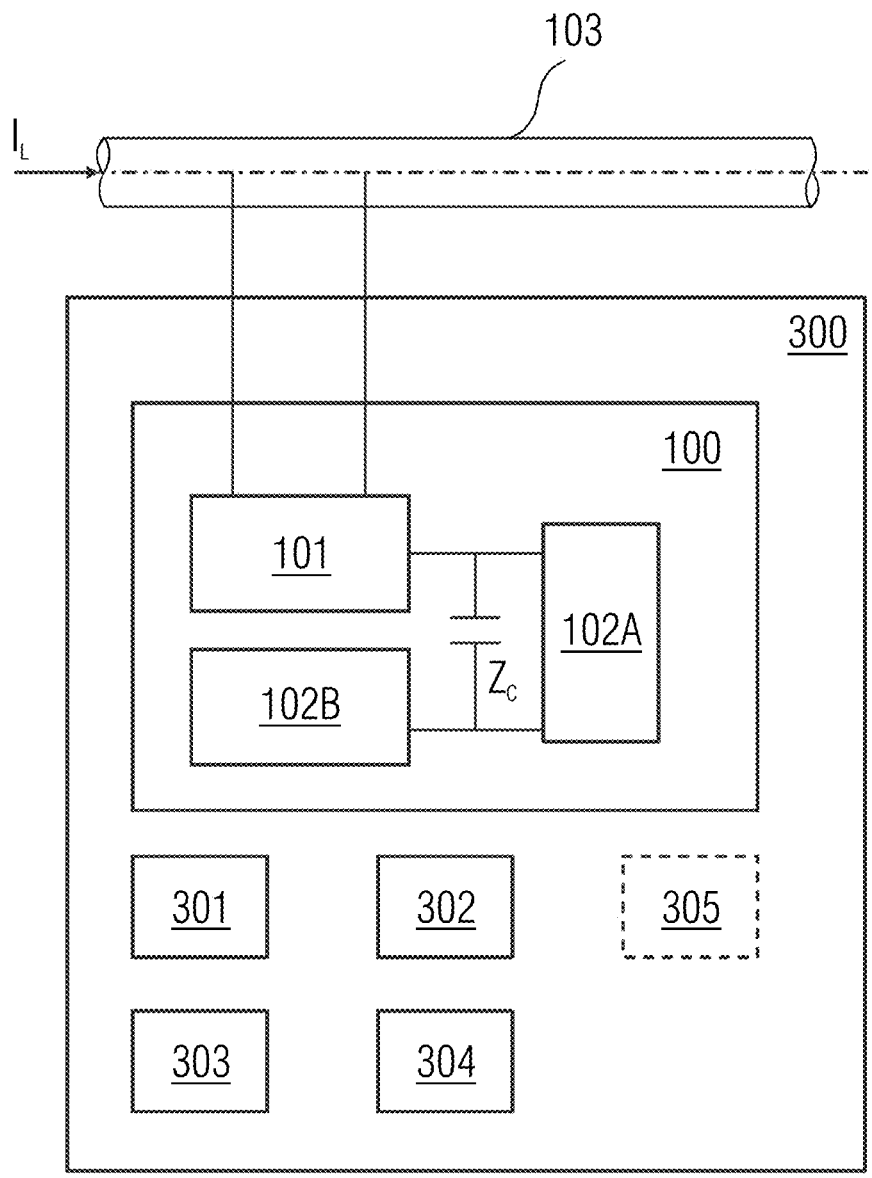
FIG. 3 illustrates a block diagram of an example of a power distribution network device that is powered by the power harvesting system disclosed in FIGS. 1-2.

FIG. 3 illustrates a block diagram of a power distribution network device 300 that is powered by the power harvesting system 100 disclosed in FIGS. 1-2. The power distribution network device 300 physically disposable on a current carrying conductor 103 of a power distribution network, includes a sensor 301, a processor 302, an indicator 303, and the power harvesting system 100. The power distribution network device 300 is a fault sensing indicator mounted on overhead power line. The power distribution network device 300 also includes a communication module 304 transmitting data associated with faults to a communication hub at a substation. The power distribution network device 300 further includes an energy storage module 305, for example, a battery to store the power being harvested by the power harvesting system 100. The power harvesting system 100 powers the sensor 301, the processor 302, the indicator 303, and the communication module 304 of the power distribution network device 300.

Although the disclosure has been illustrated and described in detail by the exemplary embodiments, the disclosure is not restricted by the disclosed examples and the person skilled in the art may derive other variations from this without departing from the scope of protection of the disclosure. It is therefore intended that the foregoing description be regarded as illustrative rather than limiting, and that it be understood that all equivalents and/or combinations of embodiments are intended to be included in this description.

It is to be understood that the elements and features recited in the appended claims may be combined in different ways to produce new claims that likewise fall within the scope of the present disclosure. Thus, whereas the dependent claims appended below depend from only a single independent or dependent claim, it is to be understood that these dependent claims may, alternatively, be made to depend in the alternative from any preceding or following claim, whether independent or dependent, and that such new combinations are to be understood as forming a part of the present specification.

The invention claimed is:

1. A power harvesting system configured to harvest power from a current carrying conductor, the power harvesting system comprising:
    an energy conversion module at least partially disposable on the current carrying conductor, the energy conversion module configured to couple an induced voltage proportional to a line current flowing in the current carrying conductor, for powering a load; and
    an impedance regulation module coupled to the energy conversion module, the impedance regulation module configured to dynamically regulate impedance in the power harvesting system for controlling transfer of the power harvested using the induced voltage and the line current, to the load, wherein the impedance regulation module comprises a switching module, a compensating impedance, and a power detection module, wherein the power detection module comprises a rectifier, a transistor, and a diode, wherein the power detection module is connected to the switching module via the rectifier, the transistor, and the diode, wherein the compensation impedance is connected to the switching module and the power detection module, wherein the power harvesting system is configured to provide a first state of operation, wherein, in the first state of operation, the power detection module keeps the switching module deactivated and the compensating impedance is connected in series with the energy conversion module, therein reducing an effective source impedance of the power harvesting system and providing a resonance effect, and wherein the first state of operation provides a maximum power transfer to the load.

2. The power harvesting system of claim 1, wherein the energy conversion module comprises a flux concentrator and a coil wound on the flux concentrator, and wherein the flux concentrator with the coil comprises a reactive component and the coil comprises a resistive component.

3. The power harvesting system of claim 2, wherein a compensating impedance of the impedance regulation module is configured to be selected based on a coil of the energy conversion module.

4. The power harvesting system of claim 3, wherein a reactance of the compensating impedance at least partially nullifies a reactance of the coil of the energy conversion module.

5. The power harvesting system of claim 1, wherein the power detection module is configured to detect the power harvested based on the induced voltage and the line current.

6. The power harvesting system of claim 5, wherein the power detection module is configured to at least partially include the compensating impedance, in communication with the switching module, when the power harvested is less than a predefined power threshold.

7. The power harvesting system of claim 6, wherein the power detection module excludes the compensating impedance when the power harvested is one of greater than a predefined power threshold and equal to the predefined power threshold.

8. The power harvesting system of claim 5, wherein the power detection module excludes the compensating impedance when the power harvested is one of greater than a predefined power threshold and equal to the predefined power threshold.

9. The power harvesting system of claim 1, wherein the power detection module excludes the compensating impedance when the power harvested is one of greater than a predefined power threshold and equal to the predefined power threshold.

10. The power harvesting system of claim 1, wherein the power harvesting system is configured to provide a second state of operation, wherein, in the second state of operation, the power detection module activates the switching module such that the compensating impedance is bypassed, and the effective source impedance is increased, and wherein the increase in the effective source impedance limits the power being transferred to the load.

11. A power harvesting system configured to harvest power from a current carrying conductor, the power harvesting system comprising:

an energy conversion module at least partially disposable on the current carrying conductor, the energy conversion module configured to couple an induced voltage proportional to a line current flowing in the current carrying conductor, for powering a load; and an impedance regulation module coupled to the energy conversion module, the impedance regulation module configured to dynamically regulate impedance in the power harvesting system for controlling transfer of the power harvested using the induced voltage and the line current, to the load, wherein the impedance regulation module comprises a switching module, a compensating impedance, and a power detection module, wherein the power detection module comprises a rectifier, a transistor, and a diode, wherein the power detection module is connected to the switching module via the rectifier, the transistor, and the diode, wherein the compensation impedance is connected to the switching module and the power detection module, and wherein the compensating impedance of the impedance regulation module is configured to be selected based on a coil of the energy conversion module.

12. The power harvesting system of claim 11, wherein a reactance of the compensating impedance at least partially nullifies a reactance of the coil of the energy conversion module.

13. A power distribution network device physically disposable on a current carrying conductor of a power distribution network, the power distribution network device comprising:

a sensor configured to measure one or more parameters associated with the current carrying conductor;

a processor configured to detect a fault in the power distribution network based on the one or more parameters;

an indicator configured to indicate the fault; and a power harvesting system configured to power the sensor, the processor, and the indicator of the power distribution network device, wherein the power harvesting system comprises:

an energy conversion module at least partially disposable on the current carrying conductor, the energy conversion module configured to couple an induced voltage proportional to a line current flowing in the current carrying conductor, for powering a load; and an impedance regulation module coupled to the energy conversion module, the impedance regulation module configured to dynamically regulate impedance in the power harvesting system for controlling transfer of the power harvested using the induced voltage and the line current, to the load, wherein the impedance regulation module comprises a switching module, a compensating impedance, and a power detection module, wherein the power detection module comprises a rectifier, a transistor, and a diode, wherein the power detection module is connected to the switching module via the rectifier, the transistor, and the diode, and wherein the compensation impedance is connected to the switching module and the power detection module.

14. The power distribution network device of claim 13, wherein the power distribution network device is a fault sensing indicator device.

15. The power distribution network device of claim 13, wherein the energy conversion module of the power harvesting system comprises a flux concentrator and a coil wound on the flux concentrator, and wherein the flux concentrator with the wound coil comprises a reactive component and the coil comprises a resistive component.

16. The power distribution network device of claim 13, wherein the power harvesting system is configured to provide a first state of operation, wherein, in the first state of operation, the power detection module keeps the switching module deactivated and the compensating impedance is connected in series with the energy conversion module, therein reducing an effective source impedance of the power harvesting system and providing a resonance effect, and wherein the first state of operation provides a maximum power transfer to the load.

17. The power distribution network device of claim 16, wherein the power harvesting system is configured to provide a second state of operation, wherein, in the second state of operation, the power detection module activates the switching module such that the compensating impedance is bypassed, and the effective source impedance is increased, and wherein the increase in the effective source impedance limits the power being transferred to the load.

* * * * *